: 
(12) United States Patent  
Hoashi

(10) Patent No.: US 6,399,999 B2  
(45) Date of Patent: Jun. 4, 2002

(54) SEMICONDUCTOR DEVICE WITH EXTRA CONTROL WIRING FOR IMPROVING BREAKDOWN VOLTAGE

(75) Inventor: Masaharu Hoashi, Tokyo (JP)

(73) Assignees: Mitsubishi Denki Kabushiki Kaisha; Mitsubishi Electric Engineering Company Limited, both of Tokyo (JP)

( * ) Notice: Subject to any disclaimer, the term of this patent is extended or adjusted under 35 U.S.C. 154(b) by 0 days.

(21) Appl. No.: 09/760,800

(22) Filed: Jan. 17, 2001

(30) Foreign Application Priority Data

Jul. 19, 2000 (JP) ..................... 2000-219325

(51) Int. Cl.[7] ........................... H01L 27/082
(52) U.S. Cl. ..................... 257/575; 257/254
(58) Field of Search ............... 257/524, 342, 257/629; 438/95

(56) References Cited

U.S. PATENT DOCUMENTS 5,554,872 A * 9/1996 Baba et al. ............... 257/342
5,592,015 A * 1/1997 Iida et al. .................. 257/524
6,054,752 A * 4/2000 Hara et al. ................. 257/629

FOREIGN PATENT DOCUMENTS

| JP | 59-151460 | 8/1984 |
| JP | 2-220445 | 9/1990 |
| JP | 2665820 | 6/1997 |

* cited by examiner

Primary Examiner—David Nelms  
Assistant Examiner—Thinh T Nguyen  
(74) Attorney, Agent, or Firm—Burns, Doane, Swecker & Mathis, LLP

(57) ABSTRACT

In a lateral bipolar transistor, a control wiring layer is laid down under an emitter electrode wiring layer, and a voltage according to a reverse bias voltage applied to the collector diffusion layer is applied to the control wiring layer, thereby preventing the occurrence of a leakage current from the emitter diffusion and further the flow of the leakage current to the device isolation region, even under a situation that a certain reverse bias voltage is applied to the collector of the transistor.

6 Claims, 3 Drawing Sheets

SEMICONDUCTOR DEVICE WITH EXTRA CONTROL WIRING FOR IMPROVING BREAKDOWN VOLTAGE

BACKGROUND OF THE INVENTION

1. Field of the Invention

The present invention relates to a semiconductor device such as lateral bipolar transistor and diode.

2. Description of Related Art

FIG. 5 is a plan view showing a conventional semiconductor device, for example, a lateral bipolar transistor as shown in Japanese Patent No. 2,665,820, and FIG. 6 is a front view in section taken along the line II—II of FIG. 5. In FIGS. 5 and 6, reference numeral 1 designates a semiconductor substrate; 2 designates an n+ type buried layer; 3 designates an epitaxial layer; 4 designates a device isolation region; 5 designates a base diffusion region; 6 designates an emitter diffusion region; 7 designates a collector diffusion region; 8 designates an insulating oxide, which is an insulating layer; 9, 10, and 11 each designate a contact hole; 12 designates a wiring layer for a base electrode; 13 designates an emitter electrode wiring layer; 14 designates a collector electrode wiring layer; 15 designates a hole; 16 designates an electron; and 17 designates an interlayer dielectric.

Here, the lateral bipolar transistor is that the emitter, base, and collector are formed on the same surface as that of a substrate crystal, and components in parallel to the surface of the flow of minor careers which are injected from the emitter dominate the operation of the transistor.

The operation will be next described below.

Typically, under such a condition that a reverse bias voltage is applied to the collector of the lateral transistor, the potential of the emitter is lowered, while the potential applied to the collector diffusion layer 7 is raised. Thus, when the voltage difference between the collector and the emitter is made larger than a reverse breakdown voltage $BV_{EOC}$, there are some occasions that a current flows out from the collector diffusion layer 7 to the emitter diffusion layer 6. In the example of FIGS. 5 and 6, however, since the collector diffusion layer 7 is separated under the emitter electrode wiring layer 13, there are no current flows from the collector diffusion layer 7 to the emitter diffusion layer 6.

However, in the example of FIGS. 5 and 6, when the emitter electrode wiring layer 13 has a lower potential than that of the collector diffusion layer 7, and the application voltage of the collector diffusion layer 7 is raised to reach the reverse breakdown voltage $BV_{EOC}$, an inversion layer (hole 15) is formed on the surface of the epitaxial layer 3, which is positioned under the emitter electrode wiring layer 13. For this reason, a leakage current from the emitter diffusion layer 6 occurs and flows out to the device isolation region 4.

Since the conventional semiconductor device is configured as described above, a leakage current occurs from the emitter diffusion layer 6 under such a condition that a reverse bias is applied to the collector of the lateral transistor, and further the leakage current flows out to the device isolation region 4, causing increased consumption power, device malfunctions, and so on. Thus, the operation range of the device cannot be enlarged.

SUMMARY OF THE INVENTION

The present invention is implemented to solve the foregoing drawbacks. It is therefor an object of the present invention to provide a semiconductor device which is capable of preventing the occurrence of a leakage current from the emitter diffusion layer to the device isolation region, even under such a condition that a reverse bias is applied to the collector.

According to a first aspect of the present invention, there is provided a semiconductor device comprising: an epitaxial layer formed on a semiconductor substrate; a device isolation region formed with a predetermined surrounding frame pattern in the epitaxial layer; an emitter diffusion layer and a collector diffusion layer which are formed in the surface area of the epitaxial layer in the device isolation region, a frame pattern of the collector diffusion layer being laid out in a fashion to surround the emitter diffusion layer; an insulating layer formed on the epitaxial layer; an emitter electrode wiring layer that is led from the emitter diffusion layer through a first contact hole opened in the insulating layer; a collector electrode wiring layer that is led from the collector diffusion layer through a second contact hole opened in the insulating layer; and a control wiring layer which is laid down under the emitter electrode wiring layer, and which is applied a voltage according to a reverse bias voltage to be applied to the collector diffusion region.

Here, it is preferable that the control wiring layer is be arranged on the insulating layer that is formed on the surface of the epitaxial layer, and that an interlayer dielectric is formed between the control wiring layer and the emitter electrode wiring layer.

In addition, the semiconductor device may further comprise a base diffusion layer laid out on the outer surface area of the collector diffusion layer, and a base electrode wiring layer that is led from the base diffusion layer through a third contact hole opened in the insulating layer in the device isolation region.

Further, a voltage not less than a reverse bias voltage applied to the collector diffusion layer may be applied to the control wiring layer.

Alternatively, a voltage less than a reverse bias voltage applied to the collector diffusion layer is applied to the control wiring layer.

Furthermore, the base electrode wiring layer may be connected to the collector electrode wiring layer.

DETAILED DESCRIPTION OF THE PREFERRED EMBODIMENTS

An embodiment of the present invention will be described below.

Embodiment 1

Figure 1:
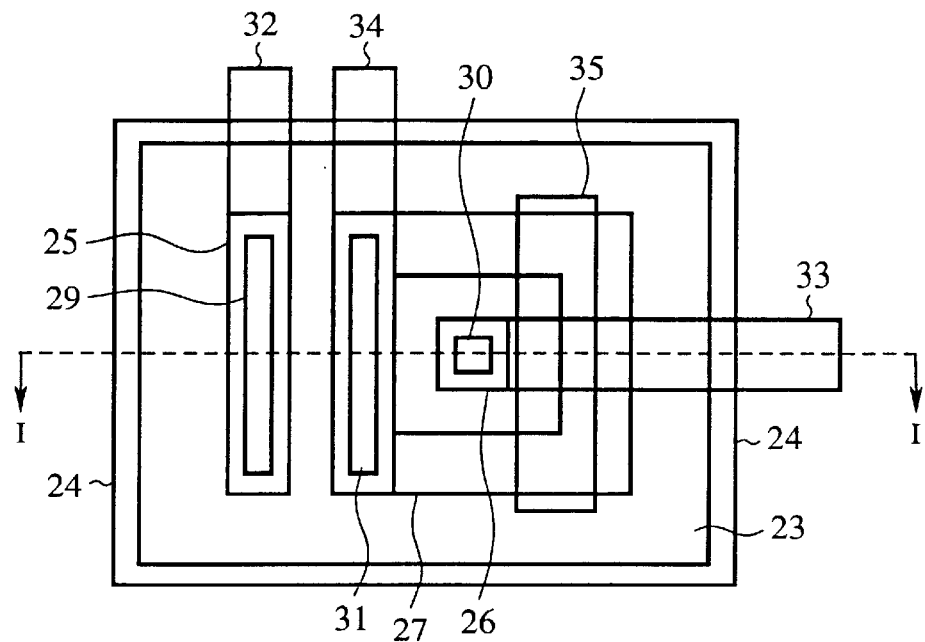
FIG. 1 is a plan view showing a semiconductor device in accordance with an embodiment 1 of the present invention.
Figure 2:
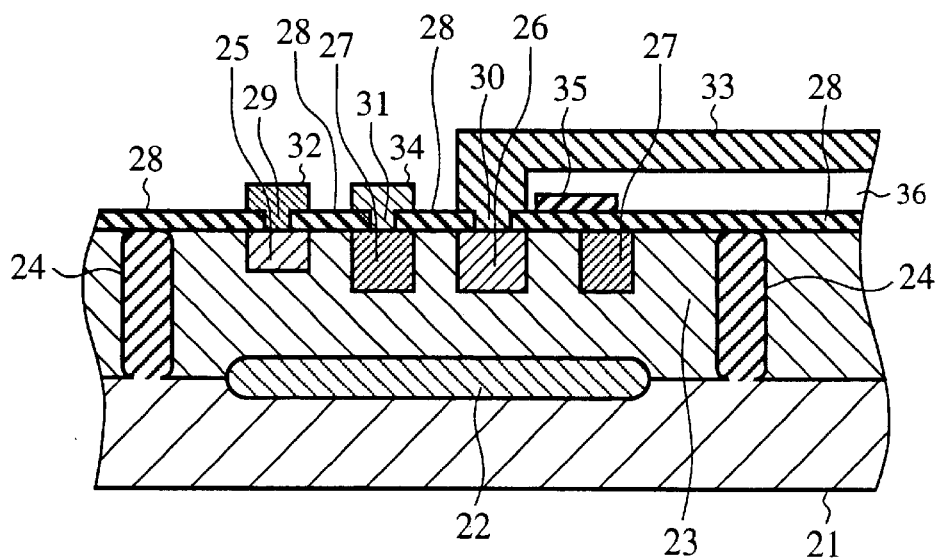
FIG. 2 is a sectional front view taken along the line I—I of FIG. 1.
Figure 3:
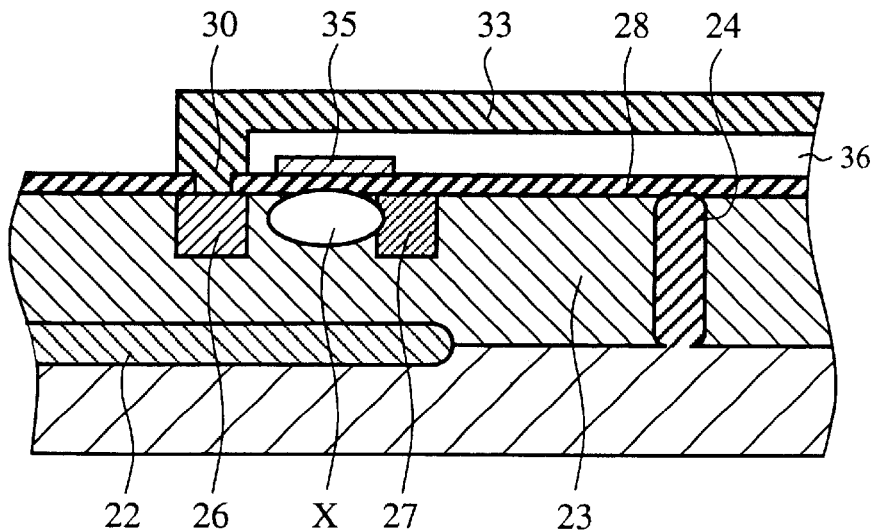
FIG. 3 is a sectional front view enlarging a part of FIG. 2.

FIG. 1 is a plan view showing a semiconductor device in accordance with an embodiment 1 of the present invention, FIG. 2 is a sectional front view taken along the line I—I of FIG. 1, and FIG. 3 is a sectional front view enlarging a part of FIG. 2. In FIGS. 1 to 3, reference numeral 21 designates a p+ type semiconductor substrate; 22 designates an n+ type buried layer for reducing collector series resistances; 23 designates an n or n− type epitaxial layer; and 24 designates a p+ type device isolation region with a rectangular frame pattern which connects to the substrate 21.

Reference numeral 25 designates an n+ type base diffusion layer; 26 designates an p+ type emitter diffusion layer; 27 designates a p+ type collector diffusion layer in a fashion to surround the emitter diffusion layer 26; 28 designates an insulating oxide (insulating layer) such as silicon oxide formed on the surface of the epitaxial layer 23; 29, 30, and 31 designate third, first, and second contact holes, respectively; 32 designates a base electrode wiring layer that is led from the emitter diffusion layer 25 through the third contact hole 29; 33 designates an emitter electrode wiring layer that is led from the emitter diffusion layer 26 through the first contact hole 30; 34 designates a collector electrode wiring layer that is led from the collector diffusion layer 27 through the second contact hole 31; 35 designates a control wiring layer to which is applied a voltage corresponding to a reverse bias voltage to be applied to the collector diffusion layer 27; and 36 designates a interlayer dielectric such as PSG (phosphosilicate glass).

The aforementioned wiring layers 32, 33, 34, and 35 are typically constituted of an aluminum-based metal and the like. The frame patterns of the device isolation region 24 and the collector diffusion region 27 are rendered by lithography, are not limited to a rectangular pattern, and may be substituted by a circular, oval, square, polygonal, or other closed pattern.

The operation will be next described below.

The semiconductor device according to the embodiment 1 is distinguishable from the conventional semiconductor device in the following points.

First, the middle portion (i.e., in the vicinity of intersecting the above wiring layer 33) on the right side of the collector diffusion layer 27, which is formed in a rectangular frame pattern, is not separated, and a frame pattern of the collector diffusion layer 27 is formed in a fashion to surround the emitter diffusion layer 26 by lithography.

Secondly, the control wiring layer 35 is laid down under the emitter electrode wiring layer 33 and on the insulating oxide 28, and thus a voltage not less than a reverse bias voltage applied to the collector diffusion layer 27 or a voltage preventing the channel inversion of the epitaxial layer 23 has to be applied to the wiring layer 35.

Figure 5:
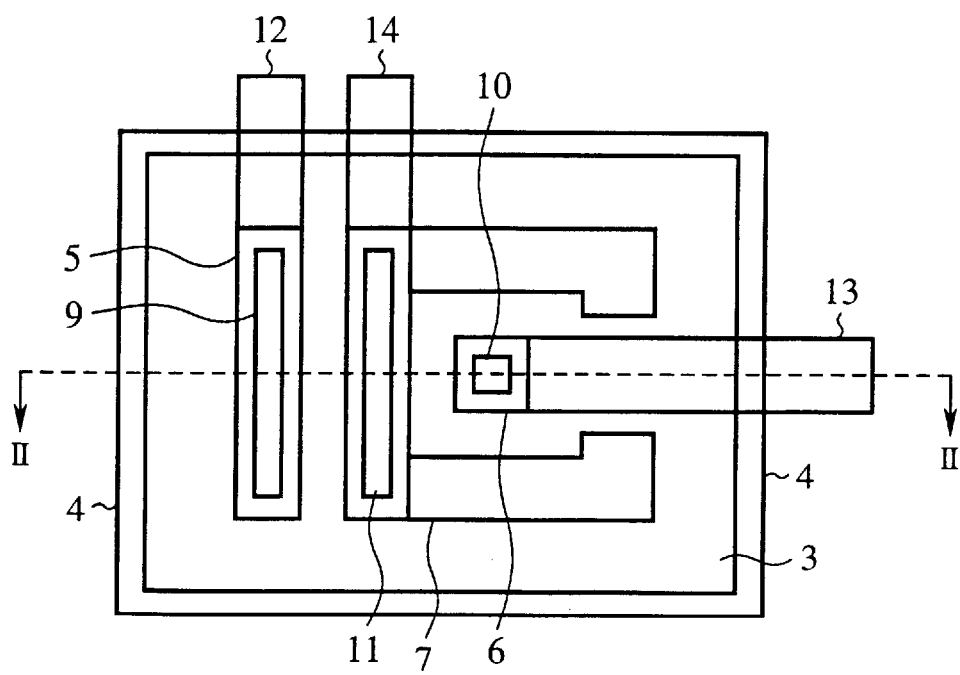
FIG. 5 is a plan view showing a conventional semiconductor device.
Figure 6:
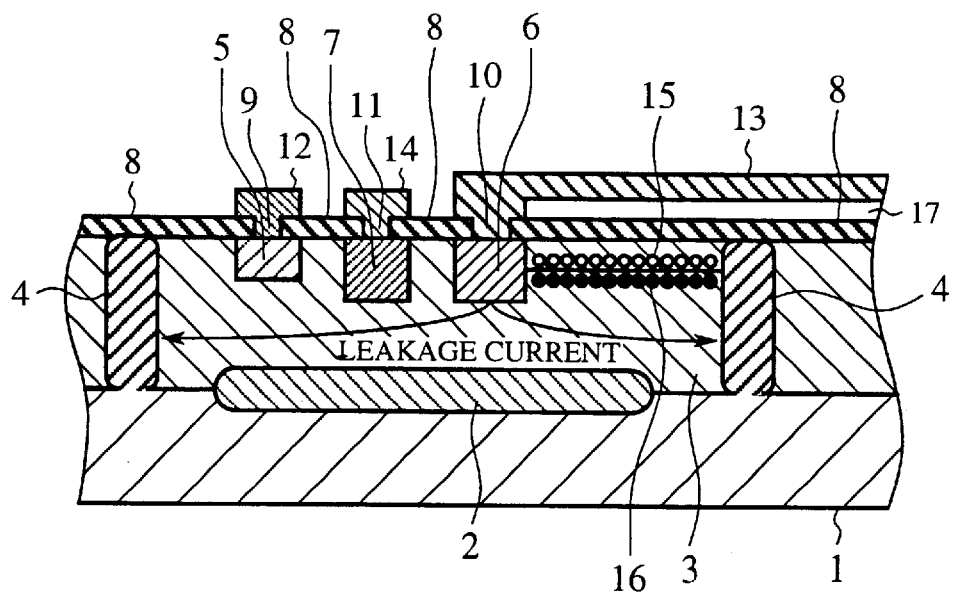
FIG. 6 is a sectional front view taken along the line II—II of FIG. 5.

In the case of the prior art of FIG. 5, under such a condition that the reverse bias voltage is applied to the collector of the lateral transistor, the emitter electrode wiring layer 13 is put in a potential lower than that of the collector diffusion layer 7. When the application voltage of the collector diffusion layer 7 is raised to reach the reverse breakdown voltage $BV_{EOC}$, as shown in FIG. 6, the inversion layer (hole 15) is formed on the surface of the epitaxial layer 3 under the emitter electrode wiring layer 13.

However, in the case of the embodiment 1, the control wiring layer 35 works to shield an electric field generated by the emitter electrode wiring layer 33 because of the aforementioned distinction, thereby preventing the formation of the inversion layer in the region X as shown in FIG. 3. For this reason, there are no current flows from the collector diffusion layer 27 to the emitter diffusion layer 26 and, at the same time, there are no leakage current flows to the device isolation region 24 in connection with the occurrence of a leakage current from the emitter diffusion layer 26.

Therefore, it is possible that the reverse breakdown voltage $BV_{EOC}$ between the collector and emitter is remarkably enhanced, which may ensure a wide operation range of the aforementioned lateral transistor or semiconductor device.

On the other hand, JP-A 59/151460 discloses a technique which arranges a wiring layer as described above over the whole effective base region. However, this technique does not assume such a situation that a reverse bias voltage is applied to the collector, and also is different from an aspect that the control wiring layer 35 is laid down at the underpart of the emitter electrode wiring layer 33, thus to be incapable of preventing the occurrence of the leakage current from the emitter diffusion layer 26.

As described above, according to the embodiment 1, the control wiring layer 35 is laid down under the emitter electrode wiring layer 33 so that a certain voltage according to a reverse bias voltage to be applied to the collector diffusion layer 27 may be applied to the control wiring layer, thereby preventing the occurrence of a leakage current from the emitter diffusion layer 26 to the device isolation region 24, even under a condition that a reverse bias voltage is applied to the collector. In such a way, power consumption and malfunction of the device may be reduced, and the enhancement of the reverse breakdown voltage $BV_{EOC}$ between the collector and emitter enables the operation range of the device.

Embodiment 2

The embodiment 1 describes an example such that a voltage not less than the bias voltage to be applied to the collector diffusion layer 27 is applied to the wiring layer 35, but a voltage less than the reverse voltage may be applied to the wiring layer 35.

In this case, though it is possible that an inversion layer is formed slightly on the surface of the epitaxial layer, the formation degree of the inversion layer can be controlled smaller than that of the above-described prior art.

Embodiment 3

Though the embodiment 1 describes an example that the emitter electrode wiring layer 33 is led to the right hand of the drawing, it is not limited to this, and may be led in the front (lower hand of FIG. 1) or rear (upper hand of FIG. 1) direction.

When the emitter electrode wiring layer 33 is led in the front direction of FIG. 1, the wiring layer 35 must be laid down under the emitter electrode wiring layer 33 between the front collector diffusion layer 27 and the emitter diffusion layer 26

Alternatively, when the emitter electrode wiring layer 33 is led in the rear direction thereof, the wiring layer 35 must be laid down under the emitter electrode layer 33 between the rear collector diffusion layer 27 and the emitter diffusion layer 26.

Embodiment 4

Figure 4:
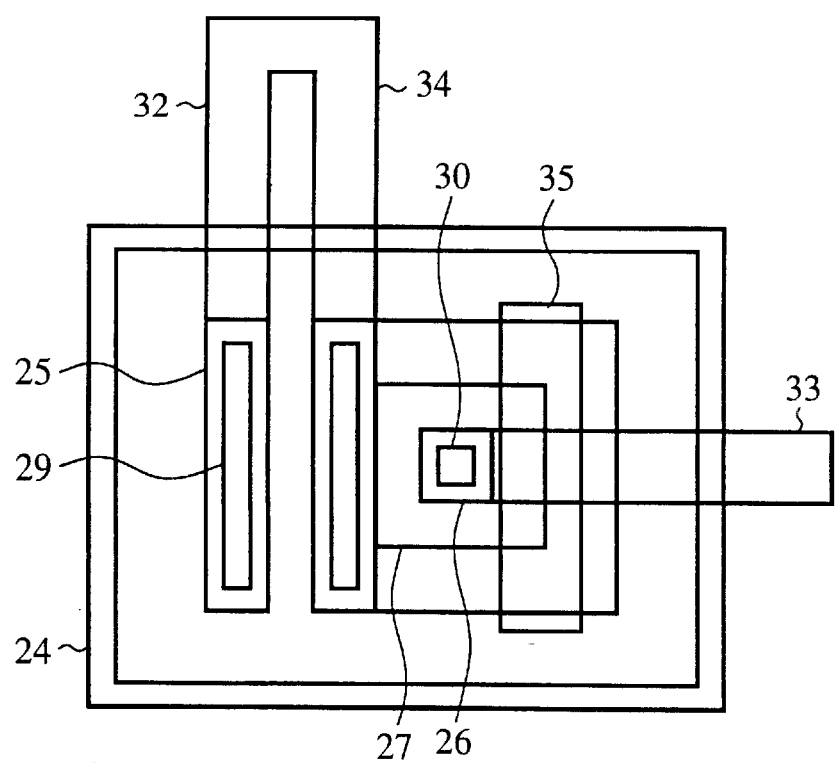
FIG. 4 is a plan view showing a semiconductor device in accordance with an embodiment 4 of the present invention.

Though the embodiment 1 describes an example that constructs a lateral transistor, as shown in FIG. 4, it may be used as a diode by connecting the base electrode wiring layer 32 and the collector electrode wiring layer 34, thereby achieving the same effect as the aforementioned embodiment 1.

In the above-described embodiments, the pnp bipolar transistor is described by way of illustrative example, but the same effect may be obtained also by an npn transistor.

As described above, according to the present invention, in a lateral bipolar transistor, a control wiring layer is laid down under an emitter electrode wiring layer so that a voltage according to a reverse bias voltage to be applied to the collector diffusion layer may be applied to the control wiring layer, thereby preventing the occurrence of a leakage current even under a condition that a reverse bias voltage is applied to the collector.

According to the present invention, since the control wiring layer is arranged on an insulating layer formed on the surface of an epitaxial layer, the control wiring layer may be laid down under the emitter electrode wiring layer.

According to the present invention, since the control wiring layer is applied a voltage not less than a reverse bias voltage that is applied to the collector diffusion layer, the occurrence of an inversion layer may be prevented surely.

According to the present invention, since the base and collector electrode wiring layers are connected to each other, the semiconductor device may be used as a diode.

What is claimed is:

1. A semiconductor device comprising:

a semiconductor substrate;

an epitaxial layer formed on said substrate;

a device isolation region formed with a surrounding frame pattern in said epitaxial layer;

an emitter diffusion layer and a collector diffusion layer which are formed in the surface area of said epitaxial layer in said device isolation region, a frame pattern of said collector diffusion layer being laid out in a fashion to surround said emitter diffusion layer;

an insulating layer formed on said epitaxial layer;

an emitter electrode wiring layer that is led from said emitter diffusion layer through a first contact hole opened in said insulating layer;

a collector electrode wiring layer that is led from said collector diffusion layer through a second contact hole opened in said insulating layer; and a control wiring layer which is laid down under said emitter electrode wiring layer, and which is applied a voltage according to a reverse bias voltage to be applied to said collector diffusion region.

2. The semiconductor device according to claim 1, wherein said control wiring layer is arranged on said insulating layer that is formed on the surface of said epitaxial layer, and an interlayer dielectric is formed between said control wiring layer and said emitter electrode wiring layer.

3. The semiconductor device according to claim 1, further comprising in said device isolation region: a base diffusion layer laid out outside said collector diffusion layer; and a base electrode wiring layer that is led from said base diffusion layer through a third contact hole opened in said insulating layer.

4. The semiconductor device according to claim 1, wherein a voltage not less than a reverse bias voltage applied to said collector diffusion layer is applied to said control wiring layer.

5. The semiconductor device according to claim 1, wherein a voltage less than a reverse bias voltage applied to said collector diffusion layer is applied to said control wiring layer.

6. The semiconductor device according to claim 1, wherein said base electrode wiring layer is connected to said collector electrode wiring layer.

* * * * *

UNITED STATES PATENT AND TRADEMARK OFFICE
CERTIFICATE OF CORRECTION

PATENT NO.   : 6,399,999 B2
DATED        : June 4, 2002
INVENTOR(S)  : Masaharu Hoashi It is certified that error appears in the above-identified patent and that said Letters Patent is hereby corrected as shown below:

<u>Title page,</u>
Title is corrected to read:
-- [54] SEMICONDUCTOR DEVICE WITH EXTRA CONTROL WIRING FOR IMPROVING REVERSE BREAKDOWN VOLTAGE --

Signed and Sealed this

Twenty-eighth Day of January, 2003

JAMES E. ROGAN
*Director of the United States Patent and Trademark Office*